United States Patent
Ramasesha et al.

(10) Patent No.: US 8,779,283 B2
(45) Date of Patent: Jul. 15, 2014

(54) ABSORBER LAYER FOR THIN FILM PHOTOVOLTAICS AND A SOLAR CELL MADE THEREFROM

(75) Inventors: Sheela Kollali Ramasesha, Bangalore (IN); Sundeep Kumar, Bangalore (IN); Mohandas Nayak, Bangalore (IN); Atanu Saha, Bangalore (IN); Hemantkumar Narsinham Aiyer, Bangalore (IN)

(73) Assignee: General Electric Company, Niskayuna, NY (US)

( * ) Notice: Subject to any disclaimer, the term of this patent is extended or adjusted under 35 U.S.C. 154(b) by 1089 days.

(21) Appl. No.: 12/040,422

(22) Filed: Feb. 29, 2008

(65) Prior Publication Data

US 2009/0139573 A1    Jun. 4, 2009

(51) Int. Cl.
 *H01L 31/00* (2006.01)

(52) U.S. Cl.
 USPC ............ 136/264; 136/262; 136/265; 136/256

(58) Field of Classification Search
 USPC ................................................ 136/262, 264
 See application file for complete search history.

(56) References Cited

U.S. PATENT DOCUMENTS

| | | | | |
|---|---|---|---|---|
| 5,137,835 A | * | 8/1992 | Karg | 438/94 |
| 5,578,503 A | * | 11/1996 | Karg et al. | 438/95 |
| 6,036,822 A | | 3/2000 | Ikeya et al. | |
| 6,048,442 A | | 4/2000 | Kushiya et al. | |
| 2005/0006221 A1 | * | 1/2005 | Takeuchi et al. | 204/192.1 |
| 2007/0004078 A1 | * | 1/2007 | Alberts | 438/95 |
| 2008/0121277 A1 | | 5/2008 | Robinson et al. | |
| 2008/0190483 A1 | * | 8/2008 | Carpenter et al. | 136/256 |
| 2008/0302413 A1 | | 12/2008 | Leidholm et al. | |

FOREIGN PATENT DOCUMENTS

| | | |
|---|---|---|
| WO | 2005089330 A | 9/2005 |
| WO | 2006101986 A | 9/2006 |

OTHER PUBLICATIONS

Charles Harper, ELectronic Materials and Processes Handbook, 2004, McGraw-Hill, 3rd, 8.60-8.64.*

Basol B. M. et al, Cuinse2 Thin Films and High-Efficiency Solar Cells Obtained by Selenization of Metallic Layers, Record of the Photovoltaic Specialists Conference, Kissimimee, May 21, 1990, New York, IEEE, US, vol. 1, May 21, 1990, pp. 546-549, XP000480326—Best Available Copy.

EP 09250481.0 Extended European Search Report, Dec. 14, 2009.

* cited by examiner

*Primary Examiner* — Miriam Berdichevsky
(74) *Attorney, Agent, or Firm* — Fletcher Yoder, P.C.

(57) ABSTRACT

A method, in certain embodiments, includes providing a metal alloy, annealing the metal alloy, and contacting the metal alloy with vapors of selenium, or sulfur, or a combination thereof. The metal alloy having a uniform first bulk composition and a first surface composition on annealing provides an annealed metal alloy having a non uniform second bulk composition and a second surface composition which on being contacted vapors of selenium, or sulfur, or a combination thereof, produces a selenized or a sulfurized metal alloy. Further the metal alloy may have a layer formed in situ from a low melting point metal within the alloy via diffusion rather than sequential deposition and co-evaporation.

20 Claims, 7 Drawing Sheets

ABSORBER LAYER FOR THIN FILM PHOTOVOLTAICS AND A SOLAR CELL MADE THEREFROM

RELATED APPLICATIONS

This application claims the benefit of a priority under 35 USC 119 to Indian Patent Application 2813/CHE/2007 filed Nov. 29, 2007, the entire contents of which is hereby incorporated by reference

BACKGROUND

The invention relates generally to the field of photovoltaics. In particular, the invention relates to a method for preparing an absorber layer used in solar cells and a solar cell made therefrom.

Solar energy is abundant in many parts of the world year around. Unfortunately, the solar energy is not used efficiently to produce electricity. The cost of solar cells and its generated electricity is generally very high. For example, a typical thin film solar cell achieves a conversion efficiency of less than 20 percent. Solar cells typically include multiple layers formed on a substrate. Unfortunately, the efficiency of these solar cells decreases with an increasing number of layers and associated interfaces, which can result in greater electrical loss opportunities. Existing manufacturing techniques are also inefficient. For example, solar cell manufacturing typically requires a significant number of processing steps. As a result, the high number of processing steps, layers, interfaces, and complexity increases the amount of time and money required to manufacture these solar cells.

BRIEF DESCRIPTION

In one embodiment, a method includes providing a metal alloy, annealing the metal alloy, and contacting the metal alloy with vapors of selenium, or sulfur, or a combination thereof, to create a selenized or a sulfurized metal alloy.

In another embodiment, a method includes providing a metal alloy having a uniform first bulk composition and a first surface composition, wherein the metal alloy comprises two or more of a group IB metal, or a group IIIA metal, or a combination thereof, annealing the metal alloy to alter the first bulk composition and the first surface composition to provide an annealed metal alloy having a non uniform second bulk composition and a second surface composition, and contacting the annealed metal alloy with vapors of selenium, or sulfur, or a combination thereof, to produce a selenized or a sulfurized metal alloy.

In another embodiment, a method includes diffusing a lower melting point metal in a metal alloy to a surface of the metal alloy to define a portion of a solar cell.

In another embodiment, a method includes providing a metal alloy having multiple layers of a solar cell without sequential deposition and without co-evaporation, wherein the metal alloy comprises two or more of a group IB metal, or a group IIIA metal, or a combination thereof.

In another embodiment, a method includes a solar cell comprising a metal alloy having a layer formed in situ from a low melting point metal within the alloy via diffusion rather than sequential deposition and co-evaporation, wherein the metal alloy comprises two or more of a group IB metal, or a group IIIA metal, or a combination thereof.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
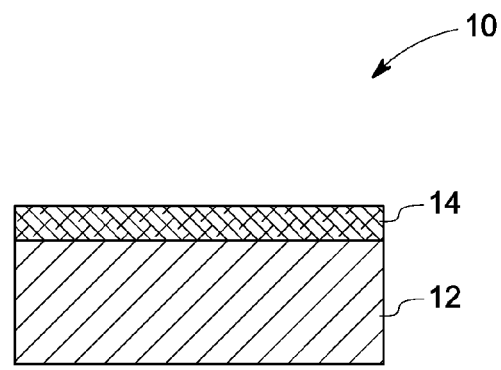
FIG. 1 is a cross-sectional view of one portion of a thin film solar cell constructed in accordance with certain embodiments of the present invention.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Moreover, the use of "top," "bottom," "above," "below," and variations of these terms is made for convenience, but does not require any particular orientation of the components. As used herein, the term "secured to" or "disposed over" or "deposited over" or "disposed between" refers to both secured or disposed directly in contact with and indirectly by having intervening layers therebetween.

As discussed in detail below, embodiments of the present technique provide a simple one-step manufacturing process, fewer layers and associated interfaces, and other simplifications to increase conversion efficiency and reduce costs associated with solar cells. For example, in certain embodiments, a manufacturing process starts with a base alloy (not multiple steps of deposition) and grows an absorber layer on the base alloy. Group IB, IIIA and VIA semiconductors are important candidate materials for low-cost photovoltaic applications. For example, the base alloy may include copper indium gallium (CuInGa or CIG), and the absorber layer may include selenide or sulfur. For example, an embodiment of the manufacturing process may include exposing a CIG alloy to selenide vapors, thereby causing a selenide layer to grow in situ on the CIG alloy. In this single step, the manufacturing process would produce copper indium gallium diselenide ($CuInGaSe_2$ or CIGS). Another suitable base alloy could include copper indium aluminum, which upon selenization could produce copper indium aluminum diselenide ($CuInAlSe_2$) in a single step. In other embodiments, sulfur could be used for the absorber layer, and could be grown in situ on the base alloy. In these embodiments, the base alloy may be strong enough to act as a back contact without any additional substrate, thereby potentially eliminating another layer of material in the solar cell.

As summarized above and discussed in further detail below, the disclosed embodiment are contrastingly different from processing by utilizing multiple steps to deposit layers on a substrate. For example, in contrast to the following disclosed embodiments, CIGS thin-film solar cells may be produced by first depositing a molybdenum base electrical contact layer onto a substrate such as glass or stainless steel. In turn, a relatively thick layer of CIGS may be deposited on the molybdenum layer. For example, the metals (e.g., Cu, In, and Ga) may be deposited onto the substrate in a sequence of manufacturing steps. Subsequently, a selenium bearing gas, such as hydrogen selenide ($H_2Se$) at temperatures ranging up to about 600 degrees Celsius, can be applied to the metals to produce CIGS. Alternatively, all of the CIGS constituents may be co-evaporated onto a hot substrate from separate thermal evaporation sources. While the deposition rates are relatively high for thermal evaporation, the sources are difficult to achieve both the required stoichiometry and thickness uniformity over large areas of a substrate. Again, as discussed in detail below, the disclosed embodiments substantially simplify the manufacturing process and number of parts to increase efficiency and reduce costs associated with solar cells.

FIG. 1 is a cross-sectional view of one portion 10 of a thin film solar cell constructed in accordance with certain embodiments of the present invention. As discussed in detail below, the portion 10 includes a first layer 12 and a second layer 14. For example, the first layer 12 may be a back contact layer (e.g., CIG), and the second layer 14 may be an absorber layer (e.g., CIGselenide, or CIGsulfur). As discussed in detail below, the absorber layer 14 may be grown in situ on the surface of the back contact layer 12. Growing the absorber layer 14 in situ on the back contact layer 12 may result in lowering the possibility of thermal stresses in the portion 10 of the solar cell.

Figure 2:
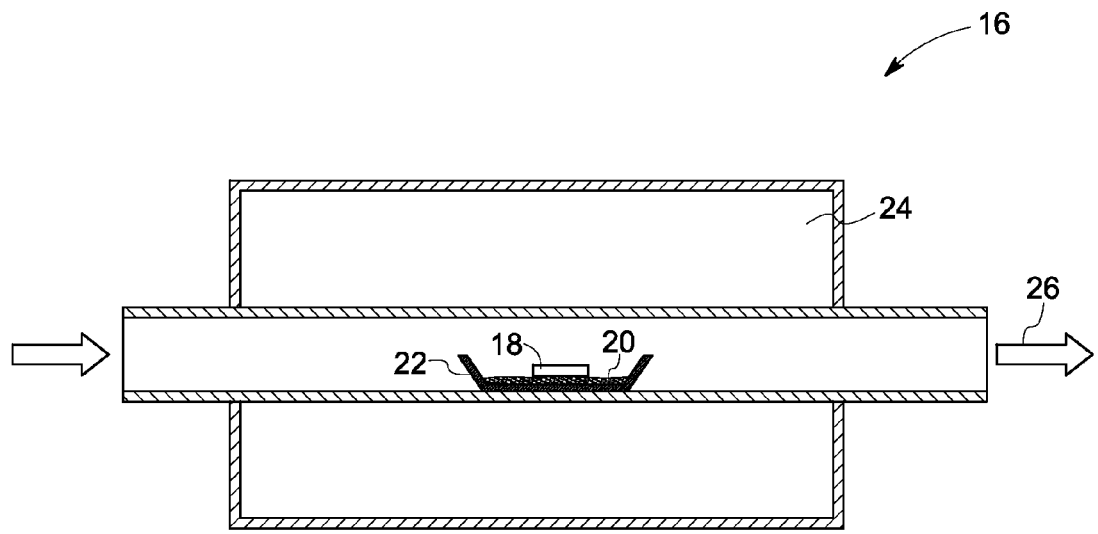
FIG. 2 is a diagram illustrating an embodiment of a selenization or sulfurization system configured to selenize or sulfurize a metal alloy for a solar cell.

FIG. 2 is a diagram illustrating a system 16 employing an apparatus and a method for constructing the portion 10 of a solar cell in accordance with certain embodiments of the present invention. As discussed in detail below, in one embodiment, the method includes the steps of providing a base metal alloy 18, annealing the base metal alloy 18, and contacting the annealed base metal alloy 18 with vapors of selenium, or sulfur, or a combination thereof. The method may be carried out under an inert atmosphere. The method may result in a step-wise change in the composition of the base metal alloy 18. In other words there may be a change in the bulk and/or the surface composition of the base metal alloy 18 before and after annealing. For example, the base metal alloy 18 as provided may have a uniform bulk composition and surface composition, e.g., the different metals used to make the base metal alloy 18 are uniformly distributed in the alloy 18. The base metal alloy 18 may comprise at least two metals, such that one metal has a lower melting point than the other. Annealing the base metal alloy 18 may result in diffusing the metal having a relatively lower melting point in the base metal alloy 18 to the surface of the base metal alloy 18. Hence, on being subjected to an annealing step, the surface composition of the base metal alloy 18 may differ from the bulk composition of the metal, resulting in an increase in an atomic percent of the metals having a relatively lower melting point in the surface of the base metal alloy 18.

As illustrated in FIG. 2, the system 16 may be employed for the selenization or the sulfurization of the base metal alloy 18. However, the system 16 also may be used to grow another absorber layer in situ on the base metal alloy 18. The base metal alloy 18 may be placed on selenium, or sulfur, or a combination thereof, (e.g., source material 20 for the formation of absorber layer) placed in a container 22. The container 22 is then placed inside a tubular furnace 24 which is maintained under an inert atmosphere by passing an inert gas 26 through the tubular furnace 24. The tubular furnace 24 is heated to a temperature that is above the melting point of selenium or sulfur (or another source material 20 for the formation of the absorber layer) resulting in the vaporization of selenium or sulfur. The vapors come in contact with the base metal alloy 18, which may result in the formation of a selenized or a sulfurized metal alloy, e.g., the portion 10 of the solar cell. Again, this technique may be used with a wide variety of base metal alloys 18 and source materials 20 for the absorber layer to be grown in situ on the base metal alloy 18. For example, the layer 12 may correspond to a first portion of the base metal alloy 18, and the layer 14 may correspond to a second portion of the base metal alloy 18. The second portion may be a result of a lower melting point material in the alloy 18 rising to the surface, and also selenization or sulfurization of the lower melting point material at the surface. In other words, the layers 12 and 14 are products of annealing the base metal alloy 18 and also selenizing or sulfurizing the base metal alloy 18.

Figure 3:
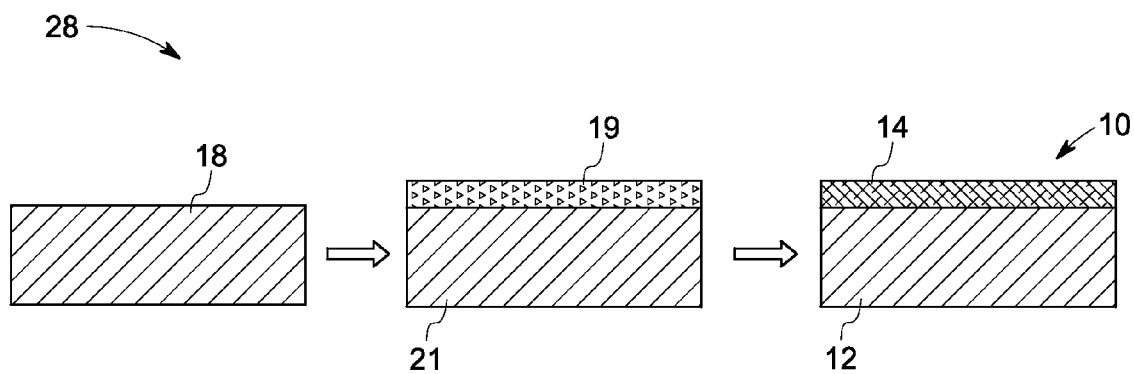
FIG. 3 is a diagram illustrating an embodiment of a manufacturing process to selenize a top surface of a metal alloy for a solar cell.

FIG. 3 is a cross-sectional view of a step 28 in the formation of portion 10 of the solar cell. The portion 10 is formed from the base metal alloy 18 using the apparatus described in FIG. 2 above. As illustrated in FIG. 3, the base metal alloy 18 gets annealed on being heated in the tubular furnace 24. As discussed above annealing may result in the in situ formation of at least two layers in the base metal alloy 18, e.g., a surface layer 19 having a relatively higher atomic percent of metals having lower melting point and a bulk layer 21 having a relatively lower atomic percent of metals having lower melting point. In the presence of selenium or sulfur, the surface layer 19 of the annealed metal alloy becomes selenized or sulfurized, thereby transforming the base metal alloy 18 into portion 10 (see FIG. 1) comprising the first and second layers 12 and 14 corresponding to the layer 21 and the absorber layer formed by the interaction of the source material with layer 19 respectively. In this particular embodiment, the layers 12 and 14 may correspond to a CIG base metal alloy 18 and a CIG-selenide or CIGsulfur absorber layer grown in situ from the base metal alloy 18 and the source material 20. The back contact layer 12 may have CIG composition having relatively lower atomic percent of In and Ga when compared to the atomic percent of In and Ga in the base metal alloy 18.

In various embodiments, the selenization or sulfurization steps described above may be carried out in a single-step or in two-steps. For example, when the selenization is carried out in one-step, the base metal alloy 18 may be placed in a container 22 containing selenium blocks 20. As the temperature in the furnace 24 increases, the base metal alloy 18 gets annealed (e.g., forms the surface layer 19 and the bulk layer 21) and simultaneously selenium or sulfur 20 melts and forms vapors. Thus the annealed surface layer 19 of the base metal alloy 18 comes in contact with the vapors of selenium, or sulfur, or a combination thereof (e.g., source material 20). When the method is carried out in two-steps, e.g., in a sequential manner, the base metal alloy 18 may be first annealed (step one) to form the surface layer 19 and the bulk layer 21 and is then brought in contact with vapors of selenium, or sulfur, or a combination thereof (step two), which can be separately melted. Selenium has a melting point of about 217 degrees Celsius and sulfur has a melting point of about 115 degrees Celsius. The base metal alloy 18 may be heated to a temperature of greater than or equal to about 200 degrees Celsius during the annealing step by controlling the heating of the furnace 24.

The tubular furnace 24 may be heated to a temperature of greater than about 200 degrees Celsius resulting in annealing of the base metal alloy 18 and melting and subsequent vaporization of selenium or sulfur 20. In one embodiment, the furnace 24 may be heated to a temperature in a range of from about 200 degrees Celsius to about 600 degrees Celsius, or from about 250 degrees Celsius to about 550 degrees Celsius, or from about 300 degrees Celsius to about 500 degrees Celsius.

In certain embodiments, the inert atmosphere 26 comprises nitrogen or argon. In one embodiment, the inert atmosphere 26 is nitrogen. In various embodiments, the base metal alloy 18 may comprise two or more of a group IB metal, or a group IIIA metal, or a combination thereof. Suitable non-limiting examples of group IB metals include copper (Cu), silver (Ag), and gold (Au). Suitable non-limiting examples of group IIIA metals (e.g., the low melting metals) include indium (In), gallium (Ga), and aluminum (Al).

In one embodiment, the base metal alloy 18 may comprise copper (Cu), indium (In), gallium (Ga), aluminum (Al), or a combination thereof. Suitable non-limiting examples of metal alloys 18 include CuInGa, CuIn, CuGa, and CuInAl. Suitable non-limiting examples of selenized or sulfurized metal alloys include $CuInGaSe_2$, $CuInSe_2$, $CuGaSe_2$, $CuInAlSe_2$, CuInGaS, CuInS, CuGaS, and CuInAlS. However, any other suitable materials may be used for the layers 12 and 14, e.g., alloy 18 and source material 20 for the absorber layer.

In one embodiment, when the base metal alloy 18 comprises CuInGa, Cu may be in a range of from about 90 to about 99 atomic percent, or from about 92 to about 97 atomic percent, from about 93 to about 96 atomic percent. In this embodiment, In may be in a range of from about 7 to about 0.1 atomic percent, or from about 6 to about 0.2 atomic percent, or from about 5 to about 0.3 atomic percent. In this same embodiment, Ga may be in a range of from about 3 to about 0.75 atomic percent, or from about 2 to about 0.65 atomic percent, or from about 1 to about 0.55 atomic percent.

In certain embodiments, the thickness of portion 10 of the solar cell may be less than or equal to about 3 millimeters. In some embodiments, the thickness of the portion 10 may be in a range of from about 0.5 millimeters to about 3 millimeters, or from about 0.7 millimeters to about 2.5 millimeters, or from about 0.8 millimeters to about 2.2 millimeters. In certain embodiments, the thickness of the absorber layer 14 of the solar cell may be less than or equal to about 5 micrometers. In some embodiments, the thickness of the absorber layer 14 may be in a range of from about 1 micrometer to about 5 micrometers, or from about 1.5 micrometers to about 4.5 micrometers, or from about 2 micrometers to about 4 micrometers.

In one embodiment, the container 22 may be made of any material that remains inert under the conditions in the tubular furnace 24. Suitable non-limiting examples of materials that can be used to make the container 22 include alumina, zirconia, magnesia, graphite, and silica. In one embodiment, the container 22 is an alumina boat (e.g., has the shape of a boat, cup, or recessed structure).

Figure 4:
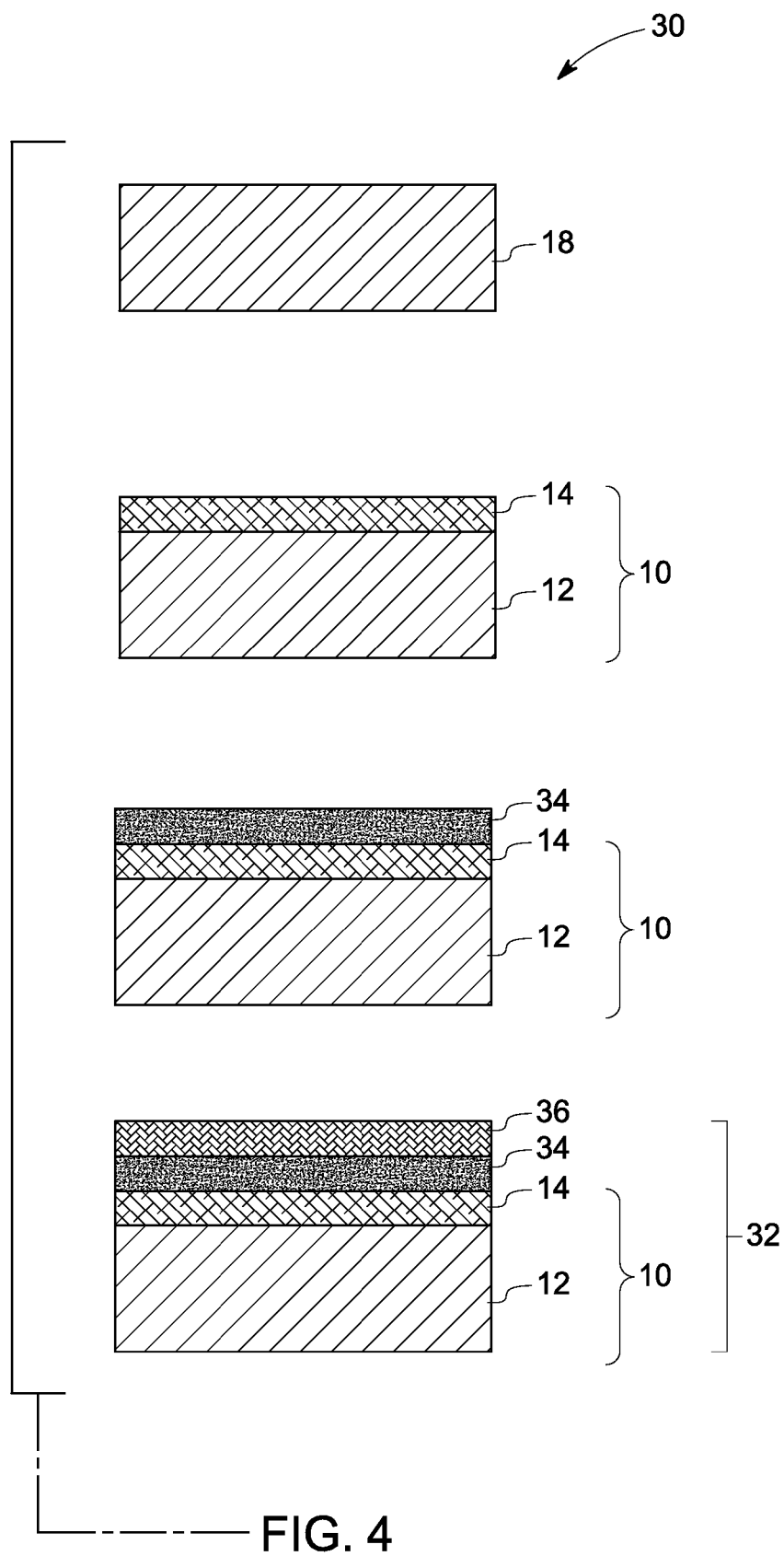
FIG. 4 is a diagram illustrating an embodiment of a manufacturing process for making a solar cell.

FIG. 4 illustrates an embodiment of a step-wise manufacturing process 30 for making a solar cell 32 and illustrates a cross-sectional view of a thin film solar cell being constructed using these steps. As discussed in detail below, the solar cell 32 includes a first portion 10 formed from a back contact layer 12 and an absorber layer 14 as illustrated in FIG. 1. The solar cell 32 further includes a buffer layer 34 and a front contact layer 36.

The buffer layer 34 and the front contact layer 36 may include a variety of materials deposited by a variety of methods. In the fabrication of CIGS type of solar cells, the buffer layer 34 may be used as n-type conductive layer. The buffer layer 34 may include one or more layers of transparent materials that are commonly used in solar cells. Suitable non-limiting examples of materials that can be used for the buffer layer 34 include semiconductors such as cadmium sulfide CdS, cadmium zinc sulfide CdZnS, zinc selenide ZnSe, cadmium selenide CdSe and their alloys. In one embodiment, the buffer layer is CdS.

The front contact layer 36 is made of a transparent material that allows the incoming radiation to reach the absorber layer 14 of the solar cell 32. The front contact layer 36 includes one or more layers of transparent conductive oxides. The transparent conductive oxides primarily function to provide the necessary conductivity while simultaneously increasing the transmission of incoming radiation to reach the absorber layer 14 of the solar cell 32, e.g., into the active region of the solar cell. Suitable non-limiting examples of materials that can be used for the front contact layer 36 include indium tin oxide (ITO), tin oxide (TO), zinc oxide (ZnO), cadmium oxide (CdO) and cadmium stannate (CdSn). In one embodiment, the front contact layer is ITO. In various embodiments, the combination of materials that may be employed as the buffer layer 34 and the front contact layer 36 include CdZnS/ZnO, CdZnS/ITO, and CdZnS/ZnO/ITO.

In certain embodiments, the buffer layer 34 may have a thickness in a range of from about 20 nanometers to about 100 nanometers, or from about 30 nanometers to about 90 nanometers, or from about 40 nanometers to about 80 nanometers. In certain embodiments, the front contact layer 36 may have a thickness in a range of from about 100 nanometers to about 300 nanometers, or from about 120 nanometers to about 280 nanometers, or from about 150 nanometers to about 250 nanometers. The materials used to form the buffer layer 34 and the front contact layer 36 may be deposited by various techniques, such as evaporation, sputtering, electro-deposition, and spraying.

Figure 5:
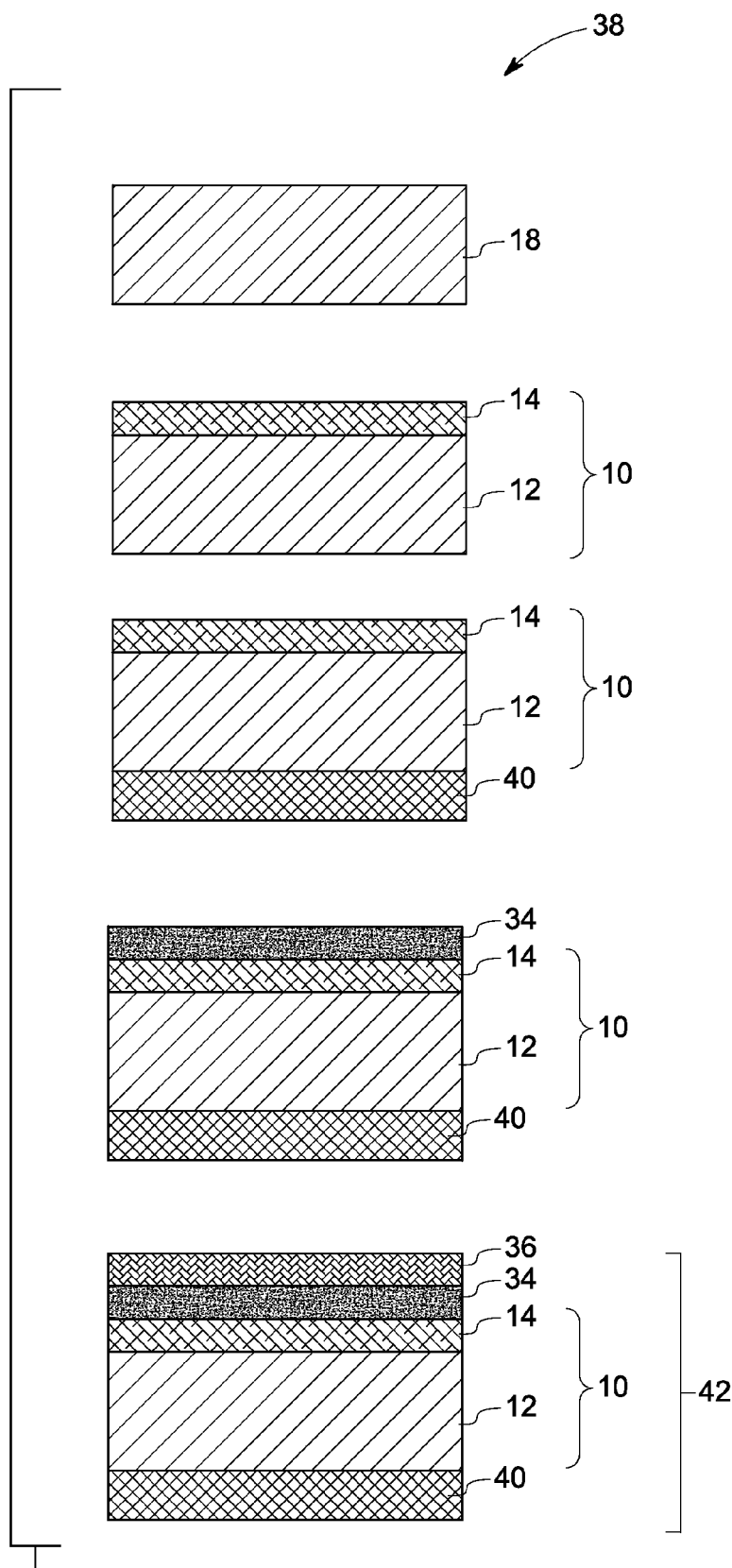
FIG. 5 is a diagram of another embodiment of a manufacturing process for making a solar cell.

FIG. 5 illustrates an embodiment of a step-wise manufacturing process 38 for making a solar cell 42 and illustrates a cross-sectional view of a thin film solar cell being constructed using these steps. The manufacturing process outlined in FIG. 5 is similar to that outlined in FIG. 4, except that the manufacture of the solar cell 42 begins with securing the portion 10 discussed in FIG. 1 on the surface of a substrate 40.

The substrate 40 can be made of any suitable rigid or flexible material, insulating or conductive, that is compatible with the processing conditions used for depositing the different layers of the solar cell. In general, the substrate 40 may be selected such that it does not adversely affect the electrical, optical or mechanical properties of the rest of the layers used in the solar cell structure. Suitable non-limiting examples of substrate 40 materials include but are not limited to sheets of glass or alumina, sheets or foils of metals such as molybdenum (Mo), tungsten (W), tantalum (Ta), titanium (Ti), gold (Au), and stainless steel. The rest of the layers, e.g., the buffer layer 34 and the front contact layer 36 may be disposed in a similar manner as discussed above in FIG. 4. The portion 10 may be secured on the substrate using an adhesive.

In one embodiment, a method includes providing a selenized or a sulfurized metal alloy, e.g., portion 10. The method includes providing a metal alloy (e.g., 18) having a uniform first bulk composition and a first surface composition, annealing the metal alloy (e.g., 18) to alter the first bulk composition and the first surface composition to provide an annealed metal alloy having a non-uniform second bulk composition 21 and a second surface composition 19, and contacting the annealed metal alloy with vapors of selenium, or sulfur, or a combination thereof (e.g., 20), whereby a selenized or a sulfurized metal alloy (e.g., 10 including layers 12 and 14) is provided. In one embodiment, providing the metal alloy (e.g., 18) includes mixing two or more of a group IB metal, a group IIIA metal, or a combination thereof, as discussed above. In one embodiment, providing the metal alloy (e.g., 18) does not include the process of sequentially deposition of two or more of a group IB metal, a group IIIA metal, and a combination thereof. In another embodiment, providing the metal alloy (e.g., 18) does not include co-evaporation of two or more of a group IB metal, a group IIIA metal, and a combination thereof.

In one embodiment, a method includes diffusing a lower melting point metal in a metal alloy (e.g., 18) to a surface layer 19 of the base metal alloy 18 to define a portion (e.g., 10) of a solar cell. As discussed above, the base metal alloy comprises two or more of a group IB metal, a group IIIA metal, and a combination thereof. The method further includes exposing the surface layer (e.g., 19) of the base metal alloy (e.g., 18) to vapors of selenium, or sulfur, or a combination thereof (e.g., 20). Additionally the method includes disposing a buffer layer (e.g., 34) on the surface of the selenized or the sulfurized metal alloy, and then disposing a front contact layer (e.g., 36) on the surface of the buffer layer.

In one embodiment, a method includes providing a metal alloy (e.g., 18) having multiple layers of a solar cell without sequential deposition and without co-evaporation, wherein the metal alloy (e.g., 18) comprises two or more of a group IB metal, or a group IIIA metal, or a combination thereof. The step of providing the metal alloy (e.g., 18) comprises annealing the base metal alloy (e.g., 18) to diffuse a low melting temperature metal to a surface (e.g., 19) of the metal alloy. The method further includes exposing the surface (e.g., 19) of the metal alloy (e.g., 18) to vapors of selenium, or sulfur, or a combination thereof (e.g., 20) to form the portion 10 of the solar cell including an absorber layer 14 and a back contact layer 12. Additionally the method includes disposing a buffer layer (e.g., 34) on the surface of the selenized or the sulfurized metal alloy, and then disposing a front contact layer (e.g., 36) on the surface of the buffer layer.

In one embodiment, a system including a solar cell comprising a metal alloy (e.g., 18) having a surface layer (e.g., 19) formed in situ from a low melting point metal within the alloy via diffusion rather than sequential deposition and/or co-evaporation, wherein the metal alloy comprises two or more of a group IB metal, or a group IIIA metal, or a combination thereof. As discussed above, the metal alloy (e.g., 18) may be selected from the group consisting of CuInGa, CuIn, CuGa, and CuInAl, and a combination thereof. In one embodiment, the low melting point metal comprises indium (In), gallium (Ga), aluminum (Al), and thalium (Tl), or a combination thereof. The method further includes exposing the surface layer (e.g., 19) formed in situ from a low melting point metal within the alloy (e.g., 18) to vapors of selenium, or sulfur, or a combination thereof (e.g., 20). Additionally the method includes disposing a buffer layer (e.g., 34) on the surface of the selenized or the sulfurized metal alloy (e.g., 10), and then disposing a front contact layer (e.g., 36) on the surface of the buffer layer.

EXAMPLES

Example 1 provides a method for the selenization of a metal alloy

Step A: Preparation of an Alloy

Alloys (e.g., 18) were prepared using copper, indium and gallium. The alloys were prepared by arc melting Cu (99.99 percent pure, obtained from Sigma Aldrich), In (99.99 percent, obtained from Sigma Aldrich), and Ga (99.999 percent pure, obtained from Sigma Aldrich). The alloy so formed was then rolled into a sheet. The sheets were then cut into three pieces, e.g., samples 1, 2 and 3. The length, breadth, and thickness of the samples were measured using a micrometer. The length, breadth, and thickness are provided in Table 1 below.

TABLE 1

| Samples | Dimensions of the pieces in millimeters | | |
|---|---|---|---|
| | Length | Breadth | Thickness |
| 1 | 20 | 20 | 0.90 |
| 2 | 20 | 20 | 2.00 |
| 3 | 20 | 20 | 0.90 |

The alloys (e.g., 18) were annealed at a temperature of about 500 degrees Celsius to study the effect of heating on the metal alloy. Indium and Gallium were found to diffuse from the bulk (e.g., 21) of the metal to the surface (e.g., 19) of the metal on annealing in the alloy (e.g., 18). When sample 4 was heated to 500 degrees Celsius for 24 hours in nitrogen atmosphere, the surface layer (e.g., 19) composition was found to be Cu:In:Ga=68:29:3 when compared with Cu:In:Ga=90:7:3 before annealing. The diffusion of In and Ga in such alloys (e.g., 18) may be driven by their relatively lower melting point when compared with melting point of copper. The composition of the surface layer (e.g., 19) after annealing depends upon the time and temperature of annealing, and initial composition of the alloy. The surface composition of the copper-indium-gallium (CIG) alloy pieces before annealing (e.g., 18) and after annealing (e.g., 18 transformed to layer 19 and layer 21) was determined using inductively coupled plasma atomic emission spectroscopy (ICP-AES) technique using ICP Ciros instrument and the values are provided in Table 2 below.

TABLE 2

| Samples | Surface Composition of metal alloy Cu/In/Ga | |
|---|---|---|
| | Before annealing | Annealing |
| 1 | 97.5/2.5/0 | 81.9/18/1/0 |
| 2 | 98.0/1.0/1.0 | 93.9/3/3.1 |
| 3 | 90.2/6.9/2.9 | 67.8/28.7/3.5 |

Step B: Preparation of Selenized Alloy

The selenization of the alloy (e.g., 18 annealed and transformed to layers 19 and 21) was carried out in a horizontal tubular furnace (obtained from V. K. Technologies, Bangalore). The furnace was initially purged with nitrogen gas and then maintained under nitrogen atmosphere during the selenization process. Selenium chunks (99.999 percent pure obtained from Sigma-Aldrich) were placed in an alumina boat (25 ml). The samples 1 and 2 prepared above (before annealing) and sample 4 (after annealing at 500 degrees Celsius) were individually placed on the selenium chunks placed in the alumina boat. The alumina boat was then loaded into the furnace and the furnace was purged with nitrogen gas. After purging nitrogen gas for about 30 minutes, the furnace was heated to about 250 degrees Celsius at a heating rate of about 2 degrees per minute. Selenization was carried out for about 12 hours at about 250 degrees centigrade while maintaining the flow of nitrogen gas. The selenized CIG alloy (e.g., layer 14 of portion 10) was characterized using an X-ray diffraction instrument from PANalytical, Netherlands. The phase formation, electrical characterization for resistivity and reflectance measurements, and the band gap of the selenized CIG alloy were measured.

TABLE 3

| Sample | Resistivity in ohm-centimeter | Band-gap in eV |
|---|---|---|
| 1 | 181 | Not measured |
| 2 | 70 | 1.36 |
| 3 | Not measured | 1.5 |

Figure 6:
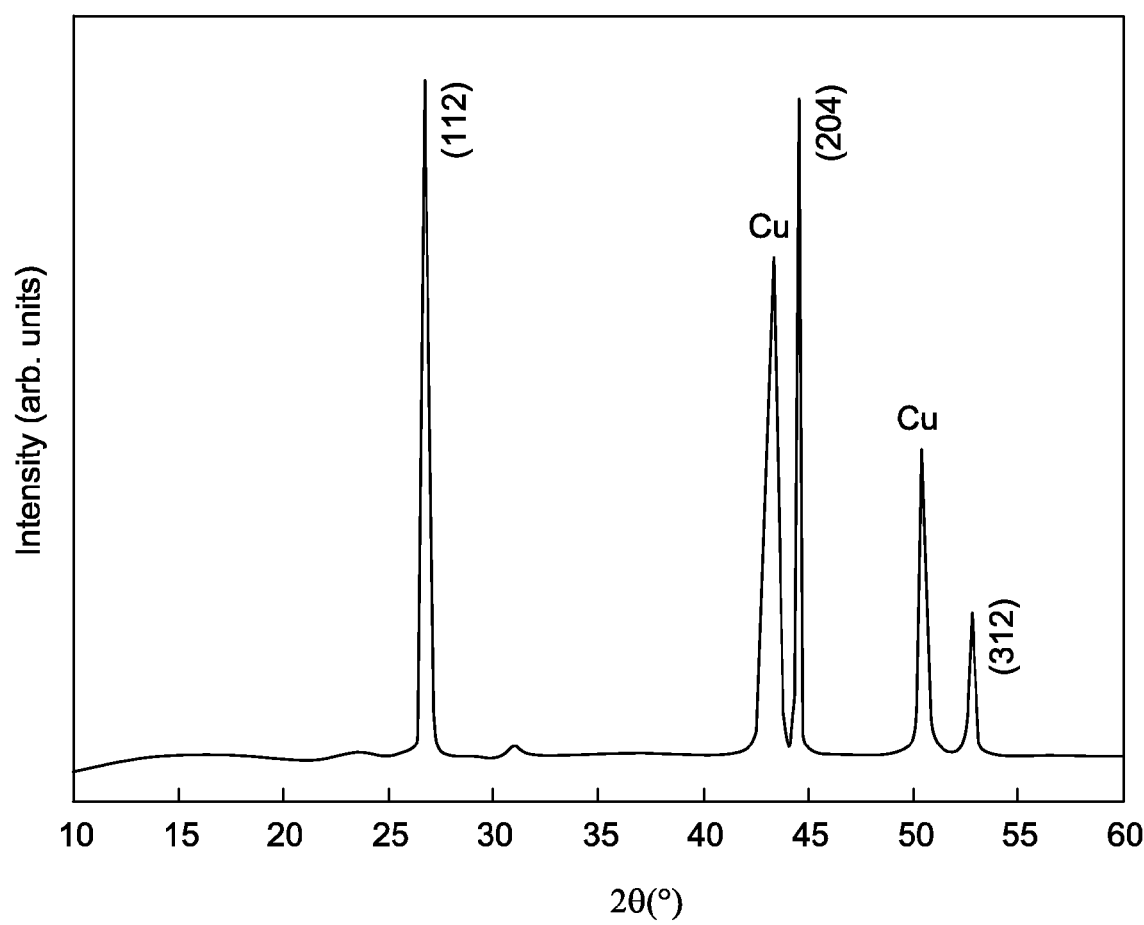
FIG. 6 is a graph illustrating an X-ray diffraction (XRD) pattern of intensity versus peak position (2 theta) of an embodiment of a selenized metal alloy for a solar cell.

FIG. 6 provides an X-ray diffraction (XRD) pattern of sample 2 provided in Table 1. The XRD pattern shows peaks from the absorber layer, e.g., the selenized CIG film formed on the surface of the metal alloy and peaks from the metal alloy. Two sets of peaks are observed since the thickness of the selenized CIG film is lower than the penetration depth of X-ray beam. All the peaks in the XRD pattern can be indexed to a tetragonal CIGS phase, with the composition close to about $CuIn_{0.7}Ga_{0.3}Se_2$ with two peaks one at about 44 degrees (2 theta) and second at about 50 degrees 2 theta belonging to copper alloy. The angle at which the incident light gets diffracted from the selenized CIG film is called theta angle and is measured in degrees. For practical reasons the X-ray diffractometer measures an angle twice that of the theta angle and is called '2 theta'. Also, degree 2 theta is a measure of inter-planar spacing in a crystalline material and is characteristic of the crystalline lattice type and the composition. From the XRD it is evident that the composition of the CIGS phase may be anywhere between $CuIn_{0.4}Ga_{0.6}Se_2$ and $CuIn_{0.8}Ga_{0.2}Se_2$, depending upon the pristine alloy composition. Thus the XRD pattern provided by FIG. 6 indicates the formation of a CIGS film.

Figure 7:
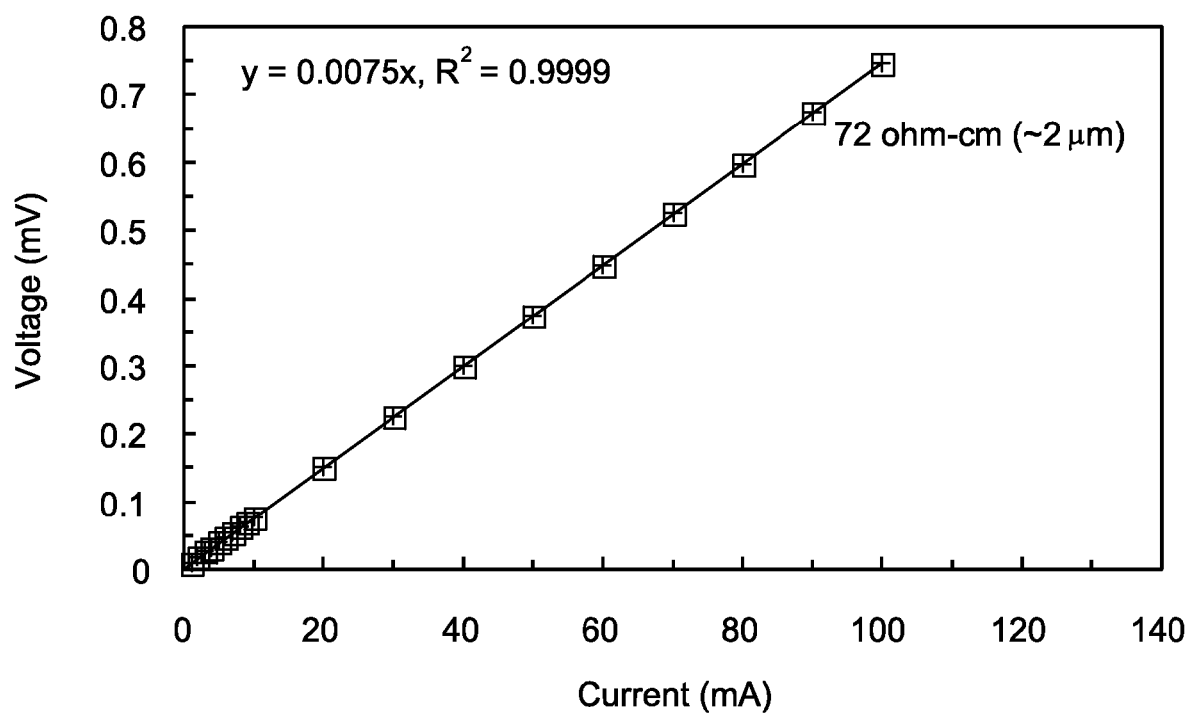
FIG. 7 is a graph illustrating voltage versus current of an embodiment of a selenized metal alloy for a solar cell.

FIG. 7 provides the electrical resistivity of sample 2 shown in Table 2. The electrical resistivity is measured in terms of a voltage versus current graph measured using a resistivity measuring instrument obtained form Keithley instruments Inc., Cleveland, Ohio. The electrical resistivity was found to be about 70 ohm-centimeter. The resistivity value falls in the typical range of values for CIG films, e.g., in a range of from about 10 ohm-centimeter to about 1000 ohm-centimeter.

Figure 8:
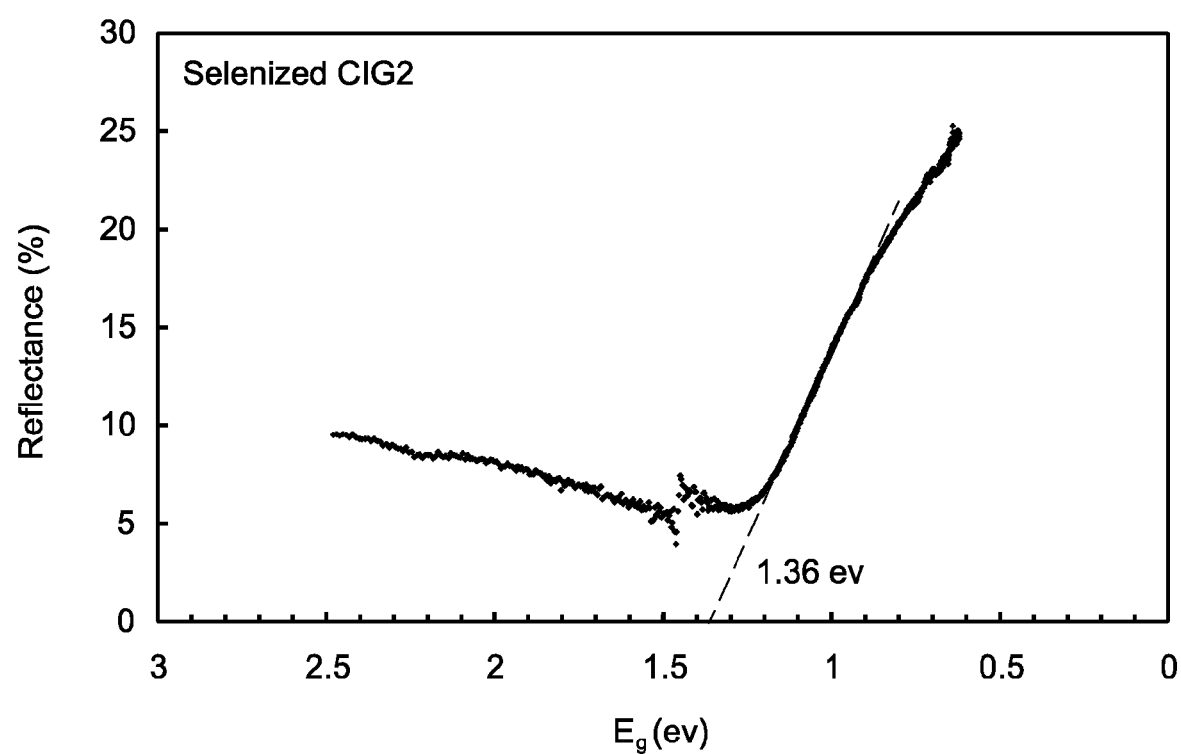
FIG. 8 is a graph illustrating reflectance versus band gap of an embodiment of a selenized metal alloy for a solar cell.

FIG. 8 provides the band-gap of the selenized sample 2 shown in Table 2. The band-gap of the selenized sample is measured in reflectance mode using (Perkin-Elmer, UV Spectrophotometer). The reflectance in percentage is plotted as a function of energy in electron volts (eV) as shown in FIG. 8. The band-gap can be calculated by extrapolating the edge to the energy axis as shown in FIG. 8. The band-gap measured from the reflectance data was found to be about 1.36 electron volts. The CIGS composition that would correspond to this band-gap may be close to $CuIn_{0.5}Ga_{0.5}Se_2$. The band-gap value falls in the range of values reported for CIGS films, e.g., in a range of from about 1.04 eV to 1.67 eV.

Figure 9:
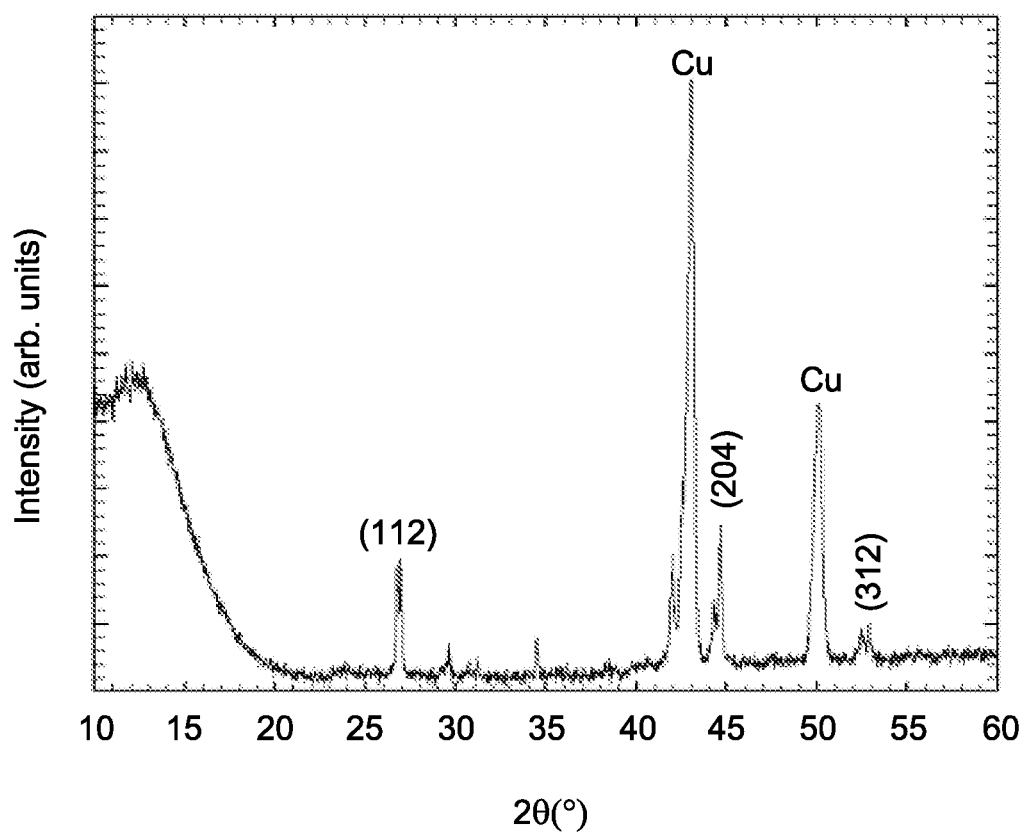
FIG. 9 is a graph illustrating an XRD pattern of intensity versus peak position (2 theta) of an embodiment of a selenized metal alloy for a solar cell.

FIG. 9 provides an X-ray diffraction (XRD) pattern of sample 3 provided in Table 2. Sample 3 was pre-annealed in vacuum at 500 degrees Celsius for 36 hours before being contacted with the selenium or sulfur vapors. Sample 3 is an example of a two-step method for forming portion 10 of the solar cell. The XRD pattern indicates that the selenized alloy formed is similar to the selenized alloy obtained for sample 2 above, thus indicating that whether we follow a one-step method as in case of sample 2 or a two-step method as in case of sample 3, for the selenization process, we obtain CIGS.

However, in either case, the disclosed embodiments reduce manufacturing steps, reduce costs, reduce weight, and improve efficiency of the solar cell. It is believed that the solar cells prepared using portion 10 described above may have improved efficiency through better current collection. The current collection may increase because more number of solar cells to be packed in a given volume as the size of each individual solar cell is decreased due to the decrease in the number of layers thus resulting in a compact and an efficient solar cell. Also since the absorber layer is grown in situ on the metal alloy the possibility of thermal stresses in the solar cell may be minimized.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method of making a solar cell, comprising:
   applying heat to a metal alloy and a source material comprising selenium, or sulfur, or a combination thereof, wherein applying the heat comprises:
   annealing the metal alloy with the heat to redistribute materials in the metal alloy to generate multiple layers, wherein the multiple layers include a surface layer and a back contact layer and wherein the surface layer is on a first side of the back contact layer;
   at least partially vaporizing the source material using the heat to form vapors of selenium, or sulfur, or a combination thereof; and
   contacting the metal alloy with the vapors of selenium, or sulfur, or a combination thereof, to selenize or sulfurize at least the surface layer of the metal alloy;
   and wherein the back contact layer of the multiple layers is the back contact layer without any additional substrate on a second side of the back contact layer opposite the first side.

2. The method of claim 1, wherein contacting comprises disposing the metal alloy in an inert atmosphere.

3. The method of claim 1, wherein the metal alloy comprises two or more of a group IB metal, or a group IIIA metal, or a combination thereof.

4. The method of claim 1, wherein the metal alloy comprises copper, indium, gallium, aluminum, or a combination thereof.

5. The method of claim 1, wherein the metal alloy comprises copper in a range from about 90 to about 99 atomic percent, indium in a range from about 7 to about 0.1 atomic percent, and gallium in a range from about 3 to about 0.75 atomic percent.

6. The method of claim 1, wherein annealing comprises heating the metal alloy to a temperature in a range from about 200 degrees Celsius to about 600 degrees Celsius.

7. The method of claim 1, wherein annealing comprises diffusing lower melting metals in the metal alloy to the surface of the metal alloy resulting in an increase in an atomic percent of the lower melting metals in the surface of the metal alloy.

8. The method of claim 1, comprising disposing a buffer layer over the surface of the selenized or the sulfurized metal alloy, or disposing a front contact layer over the surface of the selenized or the sulfurized metal alloy, or a combination thereof.

9. The method of claim 1, comprising coupling the metal alloy to a substrate.

10. A method of making a solar cell, comprising:
applying heat to a metal alloy and a source material in a chamber, wherein the metal alloy comprises two or more of a group IB metal, or a group IIIA metal, or a combination thereof, wherein the source material comprises selenium, sulfur, or a combination thereof, wherein applying the heat comprises:
annealing the metal alloy with the heat to—change a non-layered composition of the metal alloy to a layered composition having multiple layers, wherein the multiple layers include an absorber layer and a back contact layer and wherein the absorber layer is on a first side of the back contact layer;
vaporizing at least a portion of the source material to produce vapors of selenium, sulfur, or a combination thereof; and
contacting the layered composition of the metal alloy with the vapors of selenium, or
sulfur, or a combination thereof, to-treat at least the absorber layer of the metal alloy with the selenium or the sulfur;
and wherein the back contact layer of the multiple layers is the back contact layer without any additional substrate on a second side of the back contact layer opposite the first side.

11. The method of claim 10, comprising disposing a buffer layer and a front contact layer over the surface of the selenized or the sulfurized metal alloy.

12. A method of making a solar cell, comprising:
applying heat to a metal alloy and a source material in a chamber to create a layered portion of a solar cell in a single step, wherein the source material comprises selenium, or sulfur, or a combination thereof, wherein applying the heat comprises diffusing a lower melting point metal in the metal alloy to a surface of the metal alloy to generate multiple layers including a surface layer and a back contact layer and wherein the surface layer is on a first side of the back contact layer, and applying the heat comprises treating at least the surface layer with the source material to generate a treated surface layer, wherein the treated surface layer comprises at least one of the selenium or the sulfur;
and wherein the back contact layer of the multiple layers is the back contact layer without any additional substrate on a second side of the back contact layer opposite the first side.

13. The method of claim 12, wherein the metal alloy comprises two or more of a group IB metal, a group IIIA metal, or a combination thereof.

14. The method of claim 12, comprising applying the heat to cause the source material to produce vapors of selenium, or sulfur, or a combination thereof and exposing the surface layer of the metal alloy to the vapors of selenium, or sulfur, or a combination thereof.

15. The method of claim 12, comprising disposing a buffer layer, a front contact layer, or a combination thereof, over the surface of the selenized or the sulfurized metal alloy.

16. A method of making a solar cell, comprising:
generating a layered portion of a solar cell in a single step of heating a metal alloy and a source material in a chamber to simultaneously generate multiple layers in the metal alloy and treat at least a surface layer of the multiple layers with the source material, wherein the metal alloy comprises two or more of a group IB metal, or a group IIia metal, or a combination thereof, wherein the source material comprises at least one of selenium or sulfur, wherein the multiple layers include a back contact layer and wherein the surface layer is on a first side of the back contact layer;
and wherein the back contact layer of the multiple layers is the back contact layer without any additional substrate on a second side of the back contact layer opposite the first side.

17. The method of claim 16, wherein generating the layered portion of the solar cell in the single step of heating the metal alloy comprises annealing the metal alloy to diffuse a low melting temperature metal to a surface of the metal alloy.

18. The method of claim 17, comprising exposing the surface of the metal alloy to vapors of selenium, or sulfur, or a combination thereof while annealing the metal alloy.

19. The method of claim 16, comprising disposing a buffer layer and a front contact layer over the surface of the selenized or the sulfurized metal alloy.

20. The method of claim 1, wherein the source material and the metal alloy are disposed in a container, and wherein at least partially vaporizing the source material in the container causes the vapors of selenium, or sulfur, or a combination thereof to form.

* * * * *